(12) United States Patent
Bielick et al.

(10) Patent No.: US 9,578,794 B2
(45) Date of Patent: Feb. 21, 2017

(54) APPARATUS AND METHOD FOR DETACHING A COMPONENT FROM A MOUNTING SURFACE

(71) Applicant: GLOBALFOUNDRIES INC., Grand Cayman (KY)

(72) Inventors: James D. Bielick, Rochester, MN (US); Michk Huang, Taipei (TW); Yun Ting Lee, Taipei (TW)

(73) Assignee: GLOBALFOUNDRIES Inc., Grand Cayman (KY)

( * ) Notice: Subject to any disclaimer, the term of this patent is extended or adjusted under 35 U.S.C. 154(b) by 672 days.

(21) Appl. No.: 13/929,250

(22) Filed: Jun. 27, 2013

(65) Prior Publication Data

US 2014/0000105 A1    Jan. 2, 2014

(30) Foreign Application Priority Data

Jun. 29, 2012 (TW) .............................. 101123594 A

(51) Int. Cl.
B23P 19/00    (2006.01)
H05K 13/04    (2006.01)

(52) U.S. Cl.
CPC ...... *H05K 13/0486* (2013.01); *Y10T 29/49124* (2015.01); *Y10T 29/53274* (2015.01)

(58) Field of Classification Search
CPC ............... Y10T 29/53274; Y10T 29/53; Y10T 29/53283; H05K 13/0486; H05K 13/0491
USPC .................................................. 29/762, 700
See application file for complete search history.

(56) References Cited

U.S. PATENT DOCUMENTS

| | | | | |
|---|---|---|---|---|
| 3,579,795 A | * | 5/1971 | Burman | H05K 13/0491 219/230 |
| 4,366,925 A | * | 1/1983 | Fanene | H01L 24/26 156/757 |
| 4,461,073 A | | 7/1984 | Harringer et al. | |
| 4,781,408 A | | 11/1988 | Hernandes | |
| 4,852,925 A | * | 8/1989 | Lodin | H01K 3/32 29/758 |
| 7,469,457 B2 | * | 12/2008 | Ishikawa | H05K 13/0491 228/119 |
| 8,449,716 B2 | | 5/2013 | Wimplinger et al. | |

(Continued)

FOREIGN PATENT DOCUMENTS

JP     1070399 A1    3/1998

*Primary Examiner* — Peter DungBa Vo
*Assistant Examiner* — Azm Parvez
(74) *Attorney, Agent, or Firm* — Thompson Hine LLP; Anthony Canale

(57) ABSTRACT

Disclosed is an apparatus for detaching a component from a mounting surface to which the component is attached by an adhesive. The apparatus includes a right-angled hook, a curved hook, a connecting body and an adjusting member. On one side of the component, the right-angled hook protrudes into a first space between the component and the mounting surface. On another side of the component, the curved hook protrudes into a second space between the component and the mounting surface. The connecting body connects the right-angled hook and the curved hook. In response to a thermal process, the adhesion of the adhesive is reduced, and an adjustment of the adjusting member allows the curved hook to provide a shear force in order to detach the component from the mounting surface. A method for detaching a component from a mounting surface is also disclosed.

13 Claims, 6 Drawing Sheets

(56) References Cited

U.S. PATENT DOCUMENTS

2004/0111876 A1    6/2004   Cheng
2010/0043219 A1*   2/2010   Nguyen ............... H05K 7/1415
                                                            29/764
2012/0024512 A1    2/2012   Yamamoto et al.

\* cited by examiner

US 9,578,794 B2

APPARATUS AND METHOD FOR DETACHING A COMPONENT FROM A MOUNTING SURFACE

BACKGROUND

The present invention relates to an electronic assembly, and more particularly, to an apparatus and method for detaching a component in an electronic assembly.

The cooling of a heat-generating component is always an important topic. To prevent overheating-induced damage, it is necessary to cool a heat-generating component efficiently. Take an integrated circuit (IC) component as an example; its cooling is increasingly important, as the clock speed and the quantity of complementary metal-oxide-semiconductor (CMOS) components in each chip increase. In general, integrated circuit chips are cooled by a heat-dissipating component, such as a cooling block, a heat sink, a heat pipe, etc. According to the prior art, the heat sink is made of aluminum or copper and attached to a component mechanically or by means of an adhesive.

In another aspect, due to a great increase in the requirement of computation capability and capacity, important goals of system hardware design include optimizing computing/processing capability and minimizing physical space. In this regard, a solution is a printed circuit board assembly (PCBA) with a high-density of integrated circuit chips.

During a process of producing a high-level technology and high-efficiency electronic product, the capability of reworking and restoring a component of the electronic product, for example, fixing a defect of an expensive semiconductor component, cooling fins, and a substrate or restoring or reusing the component, is of vital importance in the enhancement of product yield, reduction of waste, and reduction of costs. From the perspective of PCBA rework technology that involves mounting a component in place with an adhesive, the major consideration is about whether the adhesive material can be successfully removed from a contact surface in a reworking process without damaging a component so as to enable defect repair, chip replacement, and maintenance of expensive components.

Regarding a heat sink or other heat-dissipating components used in the aforesaid PCBA technology, PCBA technology is highly sensitive to temperature variation, and the spacing between high-density components of a PCBA is also dwindling, so it is intricate and difficult to remove a heat sink during an assembly process in order to perform rework thereon.

A conventional process of removing a heat sink comprises the steps of: placing a PCBA in a convection oven; heating the PCBA at a specific temperature for 5-15 minutes (wherein the temperature and time depend on the type of the adhesive used); removing the PCBA from the oven after the required temperature (a typical temperature of approximately 125° C.) is reached; and removing the heat sink manually under a torque parallel to the plane of a heat sink or by means of a cleave tool.

The aforesaid prior art has drawbacks. First, due to very small spacing between high-density components of a PCBA, the space between the high-density components of the PCBA is quite limited. It is difficult to remove the heat sink, and the removal of the heat sink must be under careful consideration of how to apply force thereon or requires additional layout space designed beforehand. Second, the probability of removing the heat sink successfully depends on a maintenance engineer's related work experience, especially the maintenance engineer's skill and ability. If the duration of the removal process is long, component temperature will be lower than an operable temperature such that the removal process cannot be successfully performed. Third, a conventional process of separating an integrated circuit chip and a heat sink often causes BGA lid to come off, thereby rework costs are added.

Accordingly, there exists a need in the art to overcome the deficiencies and limitations described hereinabove.

SUMMARY OF THE INVENTION

In an aspect, an embodiment of the invention provides an apparatus and method for removing a component in an electronic assembly process reliably and efficiently.

In an aspect, an embodiment of the invention provides an apparatus and method for removing a component in an electronic assembly so as to perform rework and the cost thereof are significantly reduced.

In an aspect, an embodiment of the invention provides a rework technique whereby components of a heat sink assembly can be restored, reused, and recycled, without causing any damage to an electronic component (including but not limited to a chip or a chip carrier).

An embodiment of the invention provides an apparatus for detaching a component from a mounting surface. The component is attached to the mounting surface by an adhesive. The apparatus comprises a right-angled hook, a curved hook, a connecting body and an adjusting member. On one side of the component, the right-angled hook protrudes into a first space between the component and the mounting surface. On another side of the component, the curved hook protrudes into a second space between the component and the mounting surface. The connecting body connects the right-angled hook and the curved hook. The adjusting member is coupled to one of the curved hook and the right-angled hook for adjusting a distance between the right-angled hook and the curved hook. In response to a thermal process, the adhesion of the adhesive decreases, and the adjustment of the adjusting member allows the curved hook to provide a shear force in order to detach the component from the mounting surface.

According to an embodiment of the invention, the adjusting member is an adjustable bolt member. The adjustable bolt member comprises a bolt and an adjustment holder, the connecting body comprises a cylinder, the curved hook is disposed on the adjustment holder, and the cylinder comprises a thread. The bolt, the adjustment holder, and the thread of the cylinder are operatively coupled, wherein the bolt is rotated to move the adjustment holder and thereby adjust the distance between the right-angled hook and the curved hook. After the curved hook precisely protrudes into the second space between the component and the mounting surface, the detaching apparatus clamps the component tightly and generates the shear force; wherein the shear force is proportional to the adjusted distance.

An embodiment of the invention provides a method for detaching a component from a mounting surface. The component is attached to the mounting surface by an adhesive. The method comprises disposing a detaching apparatus on the component. The apparatus comprises a right-angled hook, a curved hook, a connecting body and an adjusting member. On one side of the component, the right-angled hook protrudes into a first space between the component and the mounting surface. On another side of the component, the curved hook protrudes into a second space between the component and the mounting surface. The connecting body connects the right-angled hook and the curved hook. The adjusting member is coupled to one of the curved hook and the right-angled hook for adjusting a distance between the right-angled hook and the curved hook. The method comprises driving the adjusting member to adjust the distance between the right-angled hook and the curved hook such that the detaching apparatus clamps the component tightly. The method comprises performing a thermal process on the detaching apparatus and the component to decrease the adhesion of the adhesive. The adjustment of the adjusting member allows the curved hook to provide a shear force in order to detach the component from the mounting surface.

Reference throughout this specification to features, advantages, or similar language does not imply that all of the features and advantages that may be realized with one or more embodiments of the invention should be or are in any single embodiment of the invention. Rather, language referring to the features and advantages is understood to mean that a specific feature, advantage, or characteristic described in connection with an embodiment of the invention is included in at least one embodiment of the invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments of the invention. One skilled in the relevant art will recognize that the invention may be practiced without one or more of the specific features or advantages of a particular embodiment. In other instances, additional features and advantages may be recognized in certain embodiments that may not be present in all embodiments of the invention.

The following description, the appended claims, and the embodiments of the invention further illustrate the features and advantages of the present invention.

BRIEF DESCRIPTION OF THE DRAWINGS

In order that the advantages of the invention will be readily understood, a more particular description of the invention briefly described above will be rendered by reference to embodiments that are illustrated in the appended drawings. Understanding that these drawings depict embodiments of the invention and are not therefore to be considered to be limiting of its scope, the invention will be described and explained with additional specificity and detail through the use of the accompanying drawings.

DETAILED DESCRIPTION

Figure 1:
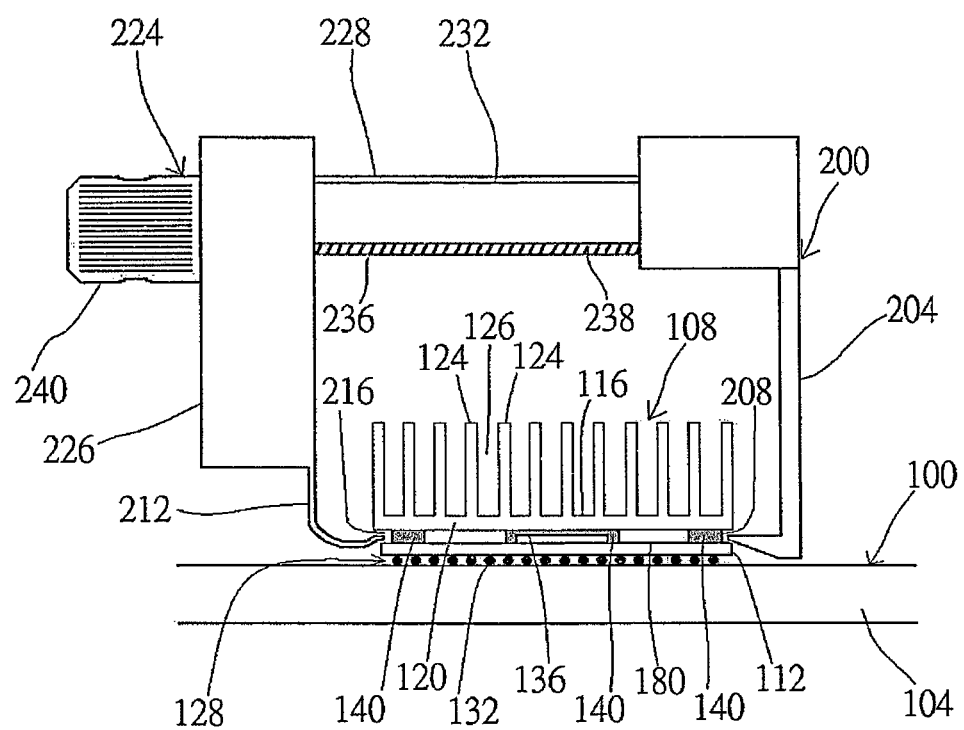
FIG. 1 illustrates an apparatus for detaching a component from a mounting surface according to an embodiment of the invention.

Starting with FIG. 1, referring to the accompanying drawing, coupled with the description below, an embodiment of the invention is illustrated. A detaching apparatus 200 for detaching a component 116 from a mounting surface 180 is disclosed. The mounting surface may be, but is not limited to, a surface of a substrate, a surface of a printed circuit board, or a surface of a ceramic circuit board. FIG. 1 is a schematic view of an electronic assembly 100 and the apparatus 200 for detaching a component from the electronic assembly 100 according to an embodiment of the invention. The electronic assembly 100 may be, but is not limited to, a motherboard, a graphics card, a PCI/PCI-E card, or each of various peripheral cards, etc. In an embodiment of the invention, the motherboard 100 comprises a large-sized printed circuit board 104. One or more packages 108, including but not limited to an electronic component package, a connector, and an LED, are disposed on the front surface of the printed circuit board 104. One of said electronic component packages 108 comprises a small-sized printed circuit board 112 disposed on the large-sized printed circuit board 104. The small-sized printed circuit board 112 defines an upper surface 180. The small-sized printed circuit board 112 may be, but is not limited to, a PCB substrate. Depending on the material it is made of, the PCB substrate may be, for example, a glass fabric substrate, a paper substrate, a resin substrate, a composite substrate, a ceramic substrate, or a metal substrate.

Referring to FIG. 1, an electrical connection device 128 is for use in electrically connecting the large-sized printed circuit board 104 and the small-sized printed circuit board 112. The electrical connection device 128 may be, but is not limited to, BGA (Ball Grid Array), QFN (Quad Flat No leads), QFP (Quad Flat Pack), CGA (Column Grid Array), or CSP (Chip Scale Package), etc. In an embodiment of the invention, the electrical connection device 128 comprises a ball grid array (BGA). The BGA 128 is disposed on the back surface of the small-sized printed circuit board 112 for mounting the small-sized printed circuit board 112 on the front surface of the large-sized printed circuit board 104. The BGA 128 comprises a plurality of spherical conductive terminals 132 arranged in accordance with a predetermined pattern. Terminal pads (not shown) respectively corresponding in position to the spherical conductive terminals 132 are disposed on the large-sized printed circuit board 104, such that the large-sized printed circuit board 104 and the small-sized printed circuit board 112 are electrically connected. The spherical conductive terminals 132 may be made of, for example, Sn—Ag—Cu (SAC), tin solder, or Sn-37Pb (wt %).

The component 116 can be disposed on the small-sized printed circuit board 112. For example, the component 116 is a heat-dissipating component, a refrigeration component, or a thermally conductive component. For example, the heat-dissipating component is a heat sink or a heat pipe. In an embodiment of the invention, the heat-dissipating component 116 is a heat sink. The heat sink 116 comprises a plate-shaped body or heat receiver 120, and a plurality of fins 124 extending uprightly upward from and perpendicular to the heat receiver 120. The fins 124 extend parallel to each other. A plurality of air channels 126 is formed between adjacent ones of the fins 124. If an air-generating unit (not shown) is in use and generates air flow to pass the air channels 126, any heat carried by the air flow will be efficiently radiated from the fins 124. The heat sink 116 may be made of, for example, Cu, Al, synthetic diamond, or another synthetic material.

An electronic component 136 which may be but not limited to an integrated circuit chip is disposed on the small-sized printed circuit board 112. In an embodiment of the invention, by means of surface mount technology (not shown), the integrated circuit chip 136 may be mounted, for example, on the small-sized printed circuit board 112.

The heat-dissipating component 116 is disposed on the upper surface of the electronic component 136 and coupled thereto by, for example, an adhesive 140 disposed between the heat-dissipating component 116 and the electronic component 136 or the small-sized printed circuit board 112; for example, the adhesive 140 is positioned at two outer edges of the small-sized printed circuit board 112 and on the electronic component 136. In other words, in an embodiment of the invention, the upper surface 180 of the small-sized printed circuit board 112 is a mounting surface for carrying related components, including but not limited to the heat-dissipating component 116, and the integrated circuit chip 136.

In an embodiment of the invention, the adhesive 140 may be, but not limited to, a glue full of particles made of a material with high thermal conductivity. The glue may be, but is not limited to, viscous organic liquid (such as silicon oil, or non-silicon high polymer). For example, the particles made of a material with high thermal conductivity include ceramic-based particles which may be, but not limited to, beryllium oxide particles, aluminum nitride particles, aluminum oxide particles, zinc oxide particles, or silicon dioxide particles, metal-based particles which may be, but not limited to, aluminum particles, beryllium particles, copper particles, or silver particles, or carbon-based particles which may be, but not limited to, diamond powder, or short carbon fibers.

In an embodiment of the invention, the detaching apparatus 200 comprises a right-angled hook 204 positioned at one side of the heat sink 116. As suggested by its name, the right-angled hook 204 is substantially right-angled and hook-shaped. The right-angled hook 204 protrudes into a first space 208 between the heat sink 116 and the upper surface 180 of the small-sized printed circuit board 112. The right-angled hook 204 may be made of, for example, aluminum, copper, steel, or any other synthetic non-metal material.

The detaching apparatus 200 further comprises a curved hook 212 positioned at the opposite side of the heat sink 116. The curved hook 212 is non-right-angled and hook-shaped. Between the curved hook and the mounting surface, an angle of curvature a is defined relative to the mounting surface 180. The curved hook 212 protrudes into a second space 216 between the heat sink 116 and the upper surface 180. The curved hook 212 may be made of, for example, stainless steel, another metal material, or any synthetic non-metal material. The detaching apparatus 200 further comprises a connecting body that connects the right-angled hook 204 and the curved hook 212. The connecting body comprises three cylinders 228, 232, 236 which may be made of, for example, aluminum, copper, steel, another metal material, or any synthetic non-metal material.

In an embodiment of the invention, the detaching apparatus 200 comprises an adjusting member 224 for adjusting the distance between the right-angled hook 204 and the curved hook 212, and thereby the right-angled hook 204 precisely protrudes into the first space 208 between the heat sink 116 and the mounting surface 180 and the curved hook 212 precisely protrudes into a second space 216 between the heat sink 116 and the mounting surface 180, so as to adjust the degree of tightness at which the detaching apparatus 200 clamps the heat sink 116.

The adjusting member 224 may be, but is not limited to, an adjustable bolt member, a spring, or the like. In an embodiment of the invention, the adjusting member 224 is an adjustable bolt member. More specifically, the adjustable bolt member 224 comprises a bolt 240 and an adjustment holder 226. The adjustment holder 226 has a hole (not shown) corresponding to the bolt 240 such that the bolt 240 can be operated in the corresponding hole. A thread 238 is disposed on the cylinder 236 and is operable in conjunction with the adjustable bolt member 224 in order to adjust the distance between the right-angled hook 204 and the curved hook 212. The curved hook 212 is disposed on the adjustment holder 226. The bolt 240, the adjustment holder 226, and the thread 238 disposed on the cylinder 236 are operatively coupled so a user can rotate the bolt 240 to move the adjustment holder 226, and thereby adjust the distance between the right-angled hook 204 and the curved hook 212. After the bolt 240 is rotated to cause the curved hook 212 to precisely protrude into the second space 216 between the heat sink 116 and the upper surface 180, the detaching apparatus 200 clamps the heat sink 116 tightly. In a thermal process (discussed in detail herein below), after the adhesion of the adhesive 140 is decreased and the intended distance is achieved by the adjustable bolt member 224, the heat sink 116 can be detached from the upper surface 180 under a shear force provided by the curved hook 212, as described in detail herein below.

Figure 2:
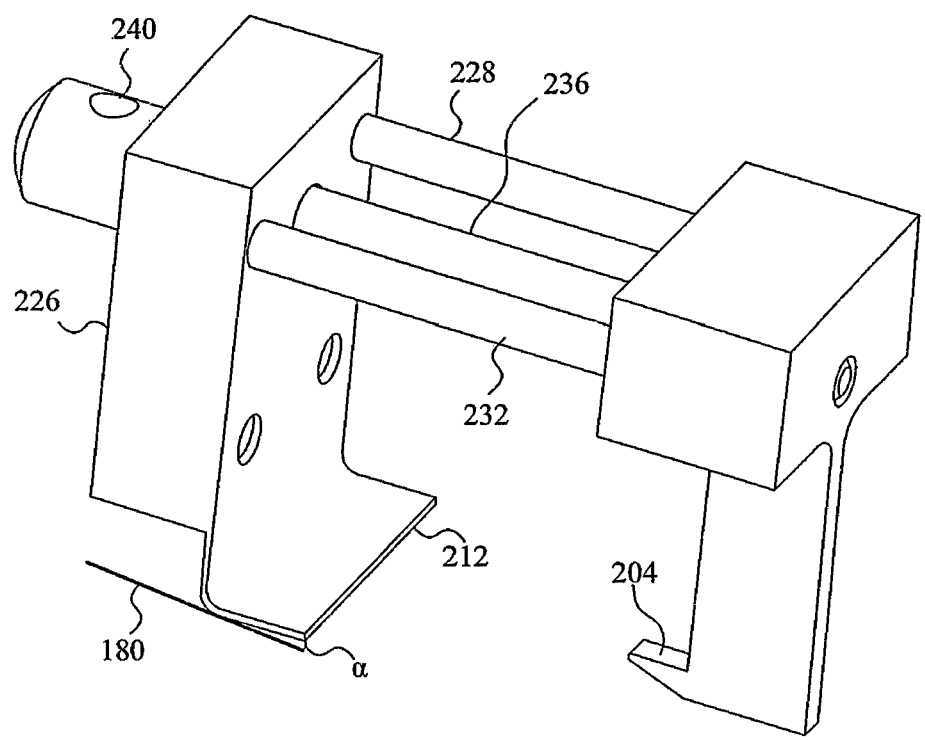
FIG. 2 is a perspective view of the apparatus of FIG. 1 according to an embodiment of the invention.

FIG. 2 is a perspective view of the detaching apparatus 200 according to an embodiment of the invention and schematically shows the right-angled hook 204, the curved hook 212, the adjustment holder 226, the bolt 240, the cylinders 228, 232, 236, and the mounting surface (upper surface) 180. Between the curved hook 212 and the mounting surface 180, an angle of curvature a is defined relative to the mounting surface 180. The angle of curvature a ranges from approximately 25° to 40°. In an embodiment of the invention, the angle of curvature is approximately 30°.

Figure 3:
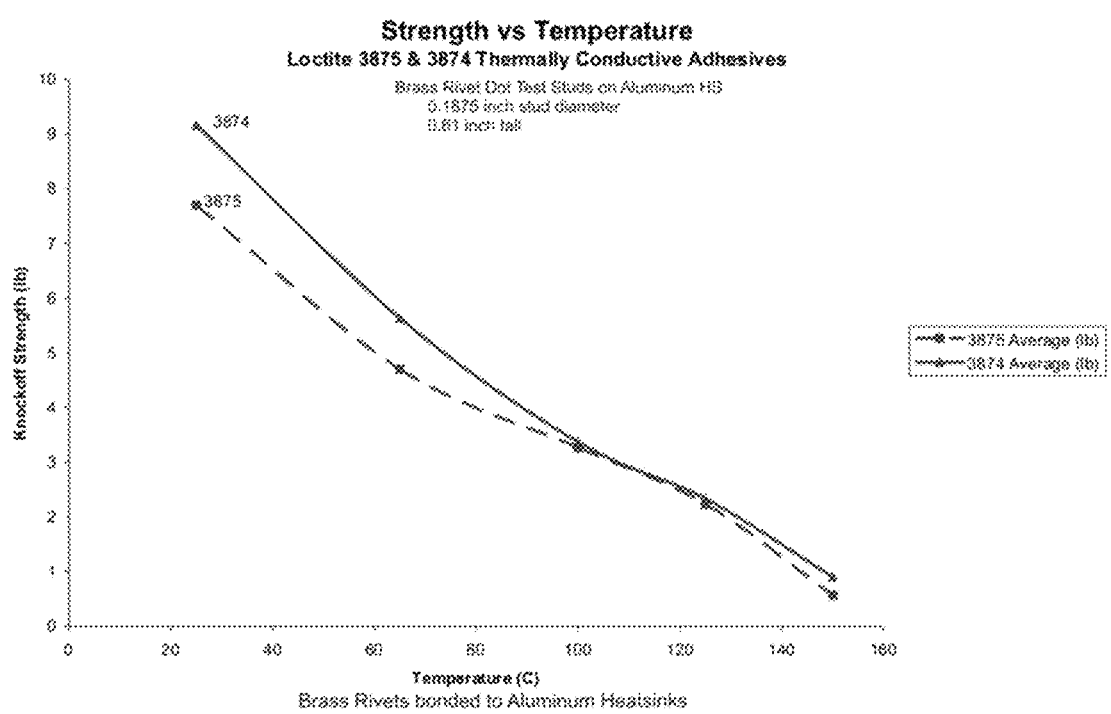
FIG. 3 is a graph of thermal profiles of different adhesives according to an embodiment of the invention.

FIG. 3 is a graph of the thermal profiles of different adhesives according to an embodiment of the invention, wherein each of the thermal profiles shows the relation between knockoff strength and temperature. In general, an adhesive material becomes fluid and the knockoff strength thereof decreases as heat increases. Therefore, as mentioned above, in a thermal process, the adhesion of the adhesive decreases as the process temperature rises. Referring to FIG. 3, graphs for Loctite 3874 and 3875, respectively, which are commercially available thermally conductive adhesives, are shown. The aforesaid technology is attributable to the related prior art and thus is not reiterated herein for the sake of brevity.

Figure 4:
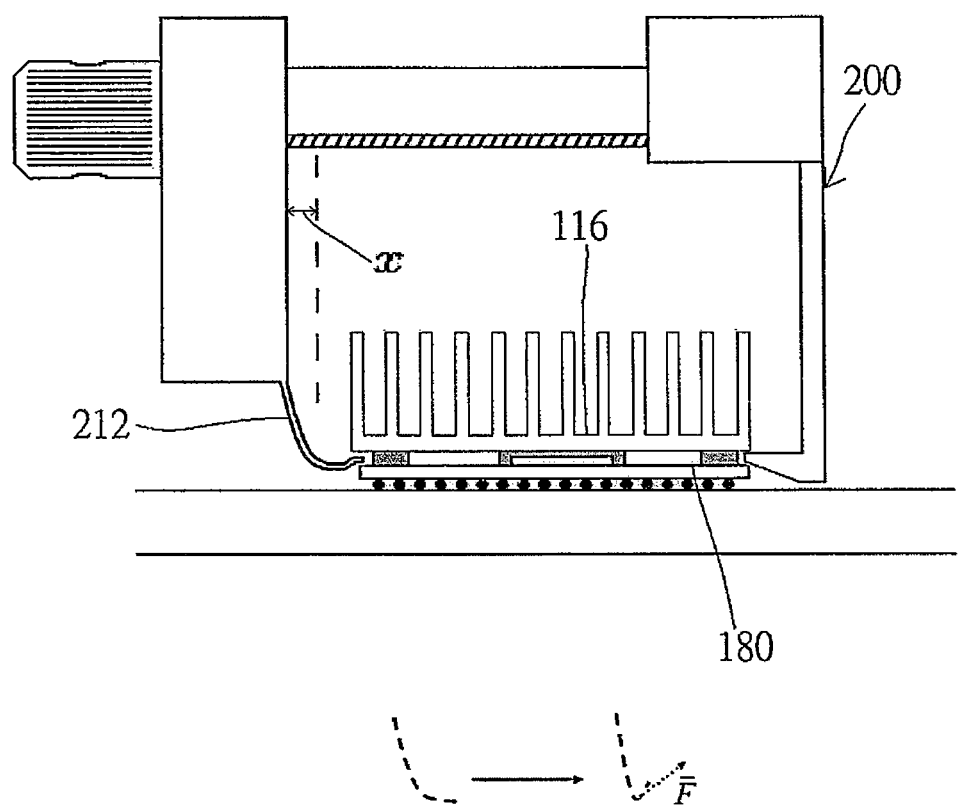
FIG. 4 is a schematic view showing a shear force provided by the apparatus of FIG. 1 according to an embodiment of the invention.

FIG. 4 is a schematic view showing a shear force provided according to an embodiment of the invention. Referring to FIG. 1, FIG. 2 and FIG. 3, in an embodiment of the invention, the shear force under which the component 116 is detached from the mounting surface 180 is calculated by Hooke's Law. If the curved hook 212 is made of stainless steel, wherein its modulus of elasticity is denoted by k, and the linear displacement of the rotated bolt 240 of the adjustable bolt member 224 is denoted by x, then the force is calculated by an equation as follows:

$$F=-kx$$

As described above, once the bolt 240 drives the adjustment holder 226 to move, the detaching apparatus 200 will clamp the component 116 more tightly, and thus the curved hook 212 will be compressed to generate a force F in the direction shown in FIG. 4. Referring to FIG. 3, at a specific operating temperature, if the force F is larger than the knockoff strength, the component 116 can be detached from the mounting surface 180.

In an embodiment of the invention, the width of the curved hook 212 is larger than the width of the right-angled hook 204 to facilitate efficient detachment of the heat-dissipating component 116. The distance between the right-angled hook 204 and the curved hook 212 is slightly larger than the width of the heat-dissipating component 116 in order to contain and tightly clamp the heat-dissipating component 116. The space jointly defined by the right-angled hook 204, the curved hook 212, the adjusting member 224, and the connecting body 220 may be large enough to accommodate the heat-dissipating component 116, but the present invention is not limited thereto. In fact, the dimensions, constituent material, synthesis, and assembly of the detaching apparatus 200 depend on its components and manufacturing process.

Figure 5:
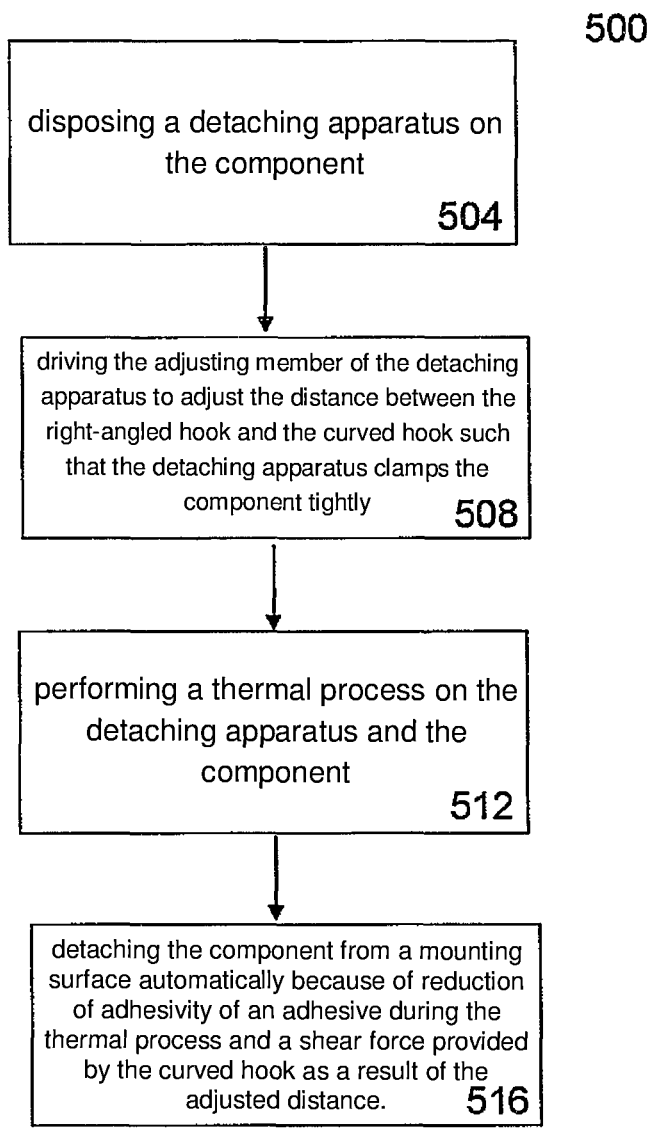
FIG. 5 is a flowchart of a method for detaching a component from a mounting surface according to an embodiment of the invention.

FIG. 5 is a flowchart of a method 500 for detaching the component 116 from the mounting surface 180 according to an embodiment of the invention. Referring to FIG. 1 through FIG. 3, and FIG. 5, method 500 comprises the step of disposing the detaching apparatus 200 on the component 116 (step 504). As mentioned earlier, the detaching apparatus 200 comprises: a right-angled hook 204, wherein on one side of the component 116, the right-angled hook 204 protrudes into a first space 208 between the component 116 and the mounting surface 180; a curved hook 212, wherein on another side of the component 116, the curved hook 212 protrudes into a second space 216 between the component 116 and the mounting surface 180; a connecting body 228, 232, 236 connecting the right-angled hook 204 and the curved hook 212; and an adjusting member 224 coupled to the curved hook 212.

The method 500 further comprises the step of driving the adjusting member 224 to adjust the distance between the right-angled hook 204 and the curved hook 212 such that the detaching apparatus 200 clamps the component 116 tightly (step 508).

The method 500 comprises the step of performing a thermal process on the detaching apparatus 200 and the component 116 (step 512). In an embodiment of the invention, the thermal process takes place at approximately 100° C. to 130° C. for approximately 5 to 8 minutes.

In the thermal process, the adhesion of the adhesive 140 decreases, and the adjusted distance causes the curved hook 212 to provide a shear force in order to detach the component 116 from the mounting surface 180. In other words, the component 116 is automatically detached from the mounting surface 180 (step 516).

Figure 6:
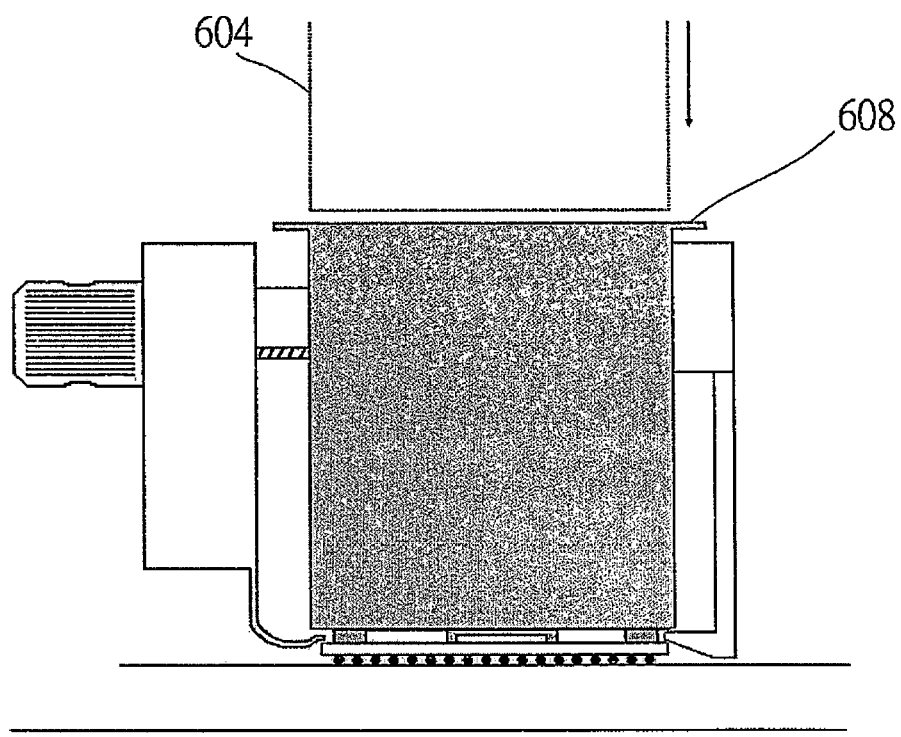
FIG. 6 illustrates a thermal process as disclosed in FIG. 5 according to an embodiment of the invention.

Referring to FIG. 6, in an embodiment of the invention, a hot air pipe 604 and a component cover 608 (including but not limited to a heat sink cover) are used in the thermal process. Hot air is discharged from the hot air pipe 604. By means of the component cover 608, the hot air is concentrated to act on the heat sink 116.

According to a typical exemplary embodiment of the invention, in various assembly processes, it is feasible to provide an apparatus and method for removing a component reliably and efficiently such that the design for flexible assembly layout space is allowed. The apparatus and method of an embodiment of the invention is advantageously characterized by a significantly shortened operation duration and a significantly low operating temperature in the thermal process. In a typical exemplary embodiment of the invention, rework is carried out in the operation having a duration as short as approximately 5 to 8 minutes at an operating temperature of approximately 100° C. to 130° C., that is, suitable for a component which does not tolerate high temperature.

In addition, the problem in the prior art that in the BGA process, the BGA lid comes off during rework can be solved efficiently by means of the detaching apparatus 200 and the method 500 according to one or more embodiments of the invention. Furthermore, because the component 116 can be automatically detached from the mounting surface 180, the detaching apparatus 200 and the method 500 may be performed without human work by hand, and thereby damage caused by a human can be reduced significantly. Furthermore, one or more embodiments of the invention are applicable to high-density PCBA technology without any requirement of given spacing between adjacent components. Furthermore, in an embodiment of the invention, the step of putting a PBCA in a convection oven and heating the PBCA before the step of detaching the component is omitted, and therefore, cost is reduced and efficiency is improved.

The aforesaid typical embodiment of the invention is exemplified by the heat sink 116 and the upper surface 180 of the small-sized printed circuit board 112. However, one or more embodiments of the invention may be applicable to different fields in a variety of forms, including but not limited to, for example, an electronic assembly, and a circuit substrate package. In another aspect, in the aforesaid typical embodiment of the invention, the curved hook 212 is disposed at the adjusting member 224. However, another configuration may be applied. For example, due to a different layout consideration, the right-angled hook 204 may be disposed at the adjusting member 224 and the curved hook 212 may be located at the other side of the connecting body.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to the best explain the principles of the embodiments, the practical application or technical improvement over technologies found in the marketplace, or to enable others of ordinary skill in the art to understand the embodiments disclosed herein.

What is claimed is:
1. An apparatus for detaching a component from a mounting surface to which the component is attached by an adhesive, the apparatus comprising:
a right-angled hook disposed on one side of the component, the right-angled hook protruding into a first space between the component and the mounting surface, wherein the right-angled hook defines a first width and is oriented at an angle relative to the mounting surface to project inwardly to said mounting surface towards said component;
a curved hook that is non-right angled and is disposed on another side of the component, the curved hook protruding into a second space between the component and the mounting surface, wherein between said curved hook and said mounting surface, an angle of curvature is defined relative to said mounting surface, wherein the curved hook defines a second width, and the first width of the right-angled hook is less than the second width of the curved hook;
a connecting body connecting the right-angled hook and the curved hook; and an adjusting member coupled to one of the curved hook and the right-angled hook, the adjusting member structured to adjust a distance between the right-angled hook and the curved hook, and if the right-angled hook protrudes precisely into the first space and the curved hook protrudes precisely into the second space then the apparatus clamps the component such that further adjustment of the adjusting member to tighten clamping of the component will compress the curved hook, wherein the curved hook is shaped to generate a shear force sufficient to detach the component from the mounting surface if compressed by the further adjustment of the adjusting member.

2. The apparatus of claim 1, wherein the adhesion of the adhesive decreases if the adhesive is subjected to heat generated by a thermal process.

3. The apparatus of claim 1, wherein the adjusting member comprises an adjustable bolt member and a spring.

4. The apparatus of claim 3, wherein the adjustable bolt member comprises a bolt and an adjustment holder, the connecting body comprises a cylinder, the curved hook is disposed on the adjustment holder, and the cylinder comprises a thread.

5. The apparatus of claim 1, wherein the angle of curvature ranges from approximately 25° to 40°.

6. The apparatus of claim 1, wherein the right-angled hook provides a fulcrum structured to enhance stability.

7. The apparatus of claim 1, wherein the component comprises a heat-dissipating component, a refrigeration component, or a thermally conductive component.

8. The apparatus of claim 1, wherein the mounting surface comprises a surface of a substrate, a surface of a printed circuit board, or a surface of a ceramic circuit board.

9. The apparatus of claim 2, wherein the thermal process comprises delivering hot air to the detaching apparatus, the component, and the mounting surface.

10. The apparatus of claim 1, wherein the adhesive comprises a glue having particles constructed of a material with high thermal conductivity.

11. The apparatus of claim 4, wherein the bolt, the adjustment holder, and the thread of the cylinder are operatively coupled, and the bolt is rotated to move the adjustment holder and thereby adjust the distance between the right-angled hook and the curved hook.

12. The apparatus of claim 1, wherein the shear force is proportional to the adjusted distance.

13. An apparatus for detaching a component from a mounting surface to which the component is attached by an adhesive, the apparatus comprising:
- a right-angled hook disposed on one side of the component, the right-angled hook protrudes into a first space between the component and the mounting surface, wherein the right-angled hook defines a first width and is oriented at an angle relative to the mounting surface to project inwardly to said mounting surface towards said component;
- a curved hook that is non-right angled and is disposed on another side of the component, the curved hook protrudes into a second space between the component and the mounting surface, wherein between said curved hook and said mounting surface, an angle of curvature is defined relative to said mounting surface, wherein the curved hook defines a second width, and the first width of the right-angled hook is less than the second width of the curved hook; wherein the curved hook defines a second width, and the first width of the right-angled hook is less than the second width of the curved hook;
- a connecting body connecting the right-angled hook and the curved hook; and
- an adjusting member coupled to one of the curved hook and the right-angled hook, the adjusting member structured to adjust a distance between the right-angled hook and the curved hook.

* * * * *